United States Patent [19]
Stevens et al.

[11] Patent Number: 4,686,460
[45] Date of Patent: Aug. 11, 1987

[54] SOLID STATE ELECTRICITY METER DISPLAY

[75] Inventors: Ray Stevens, Roswell; Duane Perry, Lawrenceville, both of Ga.

[73] Assignee: Sangamo Weston, Inc., Norcross, Ga.

[21] Appl. No.: 850,573

[22] Filed: Apr. 11, 1986

[51] Int. Cl.$^4$ .................. G01R 21/06; G01R 13/00
[52] U.S. Cl. .................................. 324/142; 340/657; 340/789; 340/870.02; 364/483; 364/518
[58] Field of Search ............... 340/715, 752, 753, 756, 340/870.02, 637, 657, 789; 364/518, 483, 754, 700; 377/112, 113; 324/142

[56] References Cited

U.S. PATENT DOCUMENTS 4,283,772  8/1981  Johnston ..................... 324/142 X Primary Examiner—Reinhard J. Eisenzopf
Assistant Examiner—Stephen M. Baker
Attorney, Agent, or Firm—Dale Gaudier

[57] ABSTRACT

In a solid state electricity meter, a display consisting of a number of juxtaposed display elements provides, in a vector form, an indication of the direction and range of power flow in the line being measured. Circuitry for driving the vector display comprises a first memory storing a plurality of power measurement references and a second memory storing corresponding vector symbols. A microprocessor compares each power measurement with the reference stored in the first memory to determine the range of power measurement and, in response, reads the corresponding vector symbol from the second memory to drive the display.

8 Claims, 10 Drawing Figures

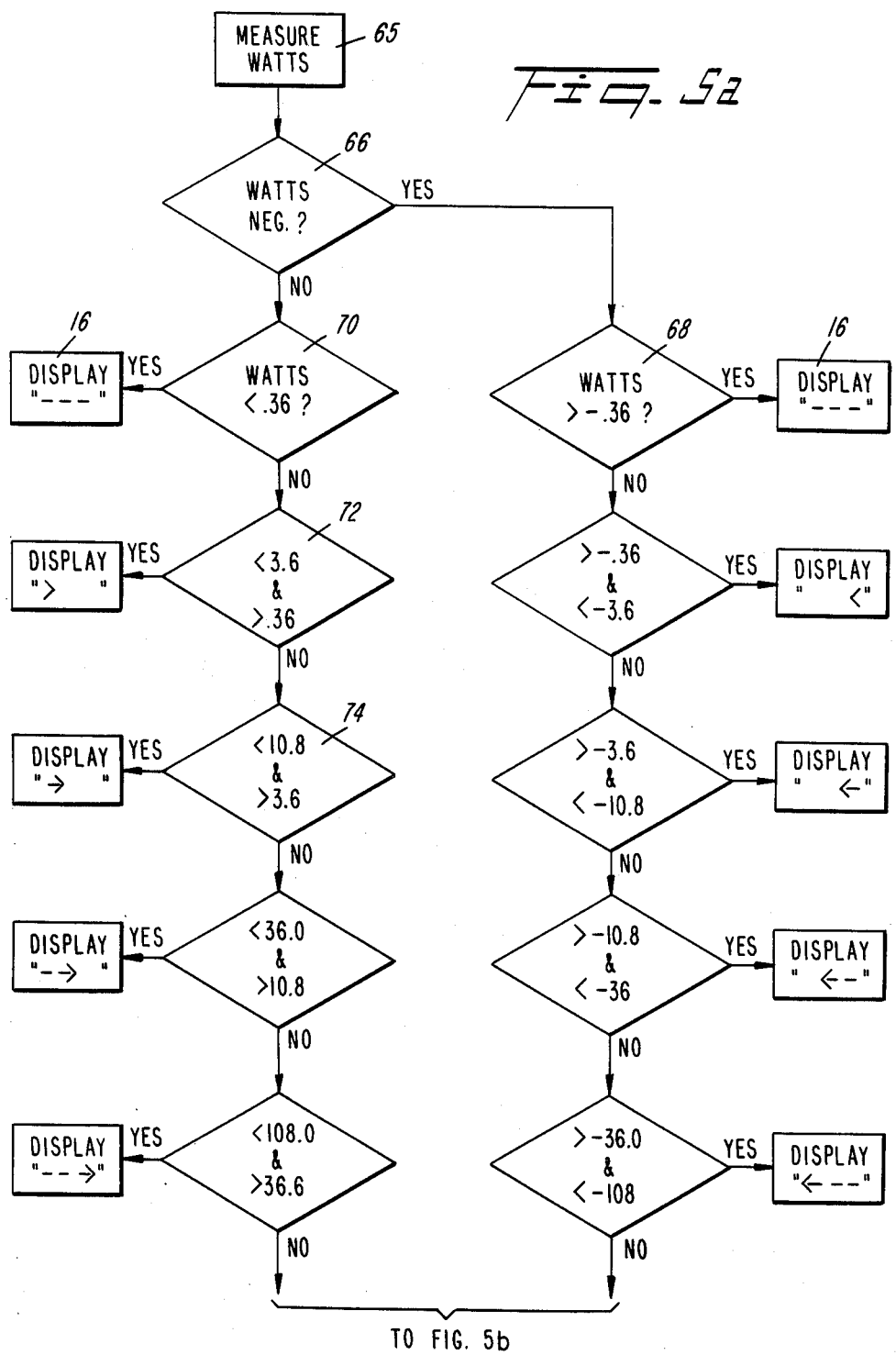

SOLID STATE ELECTRICITY METER DISPLAY

TECHNICAL FIELD

This invention relates generally to electricity meters, and more particularly, toward a solid state electricity meter having a display that simulates the rotating disk of a conventional electromechanical electricity meter to indicate the direction and approximate magnitude of power measured.

BACKGROUND ART

Electricity meters are commonly used by electrical utilities to measure the flow of, for example, electrical power quantities between the power source and customer loads. Within each meter there is a disk which acts as the rotor of a small electric motor coupled to the power line being measured and rotates at a speed proportional to power flowing through the meter.

The amount of power applied to or obtained from a load is accumulated by a register that is coupled mechanically to the disk. The register is read periodically by the utility for customer billing. To enable the utility to determine by inspection whether the meter is operative, whether power is flowing and if so, approximately at what rate and in what direction, a portion of the disk is exposed to be viewed from outside the meter.

Recently developed, microprocessor controlled meters currently becoming adopted by the electrical utilities, have capabilities to carry out numerous metering functions such as demand and time of use measurement within a single meter. One difficulty that has become apparent with such meters, however, is the inability of the meter to provide by visual inspection an indication to the utility of the direction and approximate magnitude of power flow with respect to a load as is possible in the conventional electromechanical electricity meter by simply observing the rotation of the disk.

There accordingly exists a need to provide, in a solid state electricity meter, a visual display to indicate to the utility, and possibly to the customer, the direction and approximate magnitude of power flowing in the lines being measured. A need further exists in such meters to enable the display to provide to the utility the range of power flowing in the line being monitored.

DISCLOSURE OF INVENTION

One object of the invention is to provide a solid state electricity meter having a visual display of power flow direction and approximate magnitude, to simulate the visual output provided by the rotating disks of conventional electromechanical electricity meters.

Another object is to provide a solid state electricity meter that develops a visual indication of direction and range of power magnitude measured on the power lines being monitored.

A further object is to provide a solid state electricity meter having a display that uses a small number of display elements to develop only a few non-alphanumeric symbols to present a vector representation of power flow measured in the lines being monitored.

In accordance with these and other objects of the invention, a solid state electricity meter comprising means for measuring voltage and current and multiplying the two together to obtain power includes a display for providing a visual indication of the direction and approximate magnitude of power flow in the line being monitored. The display consists of a series of display elements arranged linearly and together providing a visual representation of a vector whose direction is indicative of the direction of power flow and whose length is indicative of the range and magnitude of the power. The power measurement may be made in watt-hours, VARs, volt-amperes, etc.

In accordance with a more particular aspect of the invention the solid state electricity meter includes a first memory storing a plurality of different power reference values representing corresponding power ranges and a second memory storing corresponding symbols which, when juxtaposed on successive display elements, form vectors.

A control means, preferably a microprocessor, reads the power measurement obtained by the measurement means, determines the direction of power flow and compares magnitude to the power ranges stored in the first memory. The output of the first memory, representing the range of the power measured, addresses the second memory to obtain the corresponding set of symbols for vector display.

Still other objects and features of the invention will become more readily apparent to those skilled in the art from the following description when read in conjunction with the accompanying drawing, wherein there is shown and described a preferred embodiment of the invention simply by way of illustration of one of the best modes contemplated for carrying out the invention. As will be realized, the invention is capable of other, different, embodiments and its several details are capable of modifications in various obvious aspects, all without departing from the invention. Accordingly, the drawings and descriptions will be regarded as illustrative in nature and not as restrictive.

BRIEF DESCRIPTION OF THE DRAWING

The accompanying drawings, incorporated in and forming a part of the specification, illustrate several aspects of the present invention, and, together with the description, serve to explain the principles of the invention. In the drawings:

FIGS. 5(a)–5(b) are a flow chart of programming used in the invention.

BEST MODE FOR PRACTICING THE INVENTION

Figure 1:
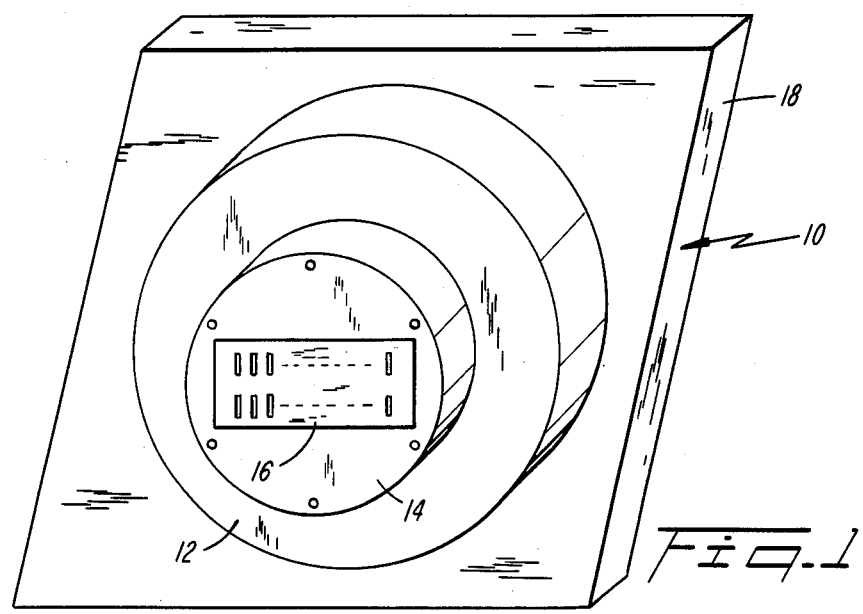
FIG. 1 is a view of solid state electricity meter in accordance with the invention.

In FIG. 1, an electricity meter 10 comprises a conventional glass electricity meter housing 12 containing a disk-shaped chassis 14 within which is located a solid state display 16 constructed in accordance with the principles of this invention. The glass housing 12, together with chassis 14, is supported on a cabinet 18 that is attached to a support at the power measurement site. Within the glass housing 12, and to the rear of plate 14, is line power measurement circuitry for driving display 16 in accordance with power in the lines being monitored.

Figure 2:
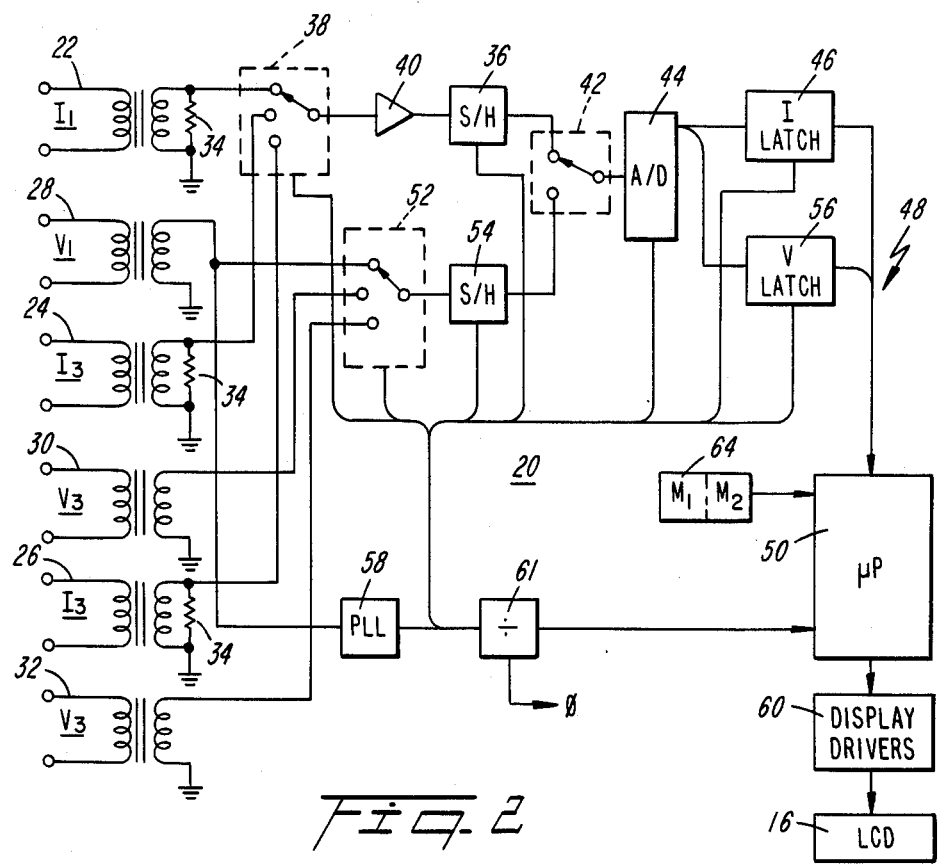
FIG. 2 is a simplified schematic diagram of circuitry forming the solid state electricity meter.

With reference to FIG. 2, such line power measurement circuitry 20 for measuring three-phase power, comprises phase current transformers 22, 24 and 26 together with phase voltage transformers 28, 30 and 32 respectively applied to the three line phases to be measured. The secondary circuits of the current transformers 22, 24 and 26 are provided with burden resistors 34 to convert a secondary circuit currents into properly scaled voltages. These scaled voltages are applied to a first sample and hold circuit (S/H) 36 through an analog switch 38 and a buffer amplifier 40. The switch 38 is controlled to sample the outputs of the three-phase current transformers 22, 24 and 26 in succession. These three current measurements are passed through an analog switch 42 to an analog-to-digital (A/D) converter 44 to be digitized, stored in a current latch 46 and thereafter transferred on bus 48 to a conventional microprocessor 50.

Similarly, phase voltages developed by voltage transformers 28, 30 and 32 are sampled successively by analog switch 52 to be supplied in sequence to sample and hold circuit 54 and thereafter through analog switch 42 to converter 44. The digitized phase voltage values in converter 44 are applied through latch 56 and bus 48 to the microprocessor 50.

Phase lock loop (PLL) 58 is synchronized to the power line at the secondary of voltage transformer 28, although the PLL could alternatively be synchronized to any one of the other voltage phases. The output of the phase locked loop 58 controls the indexing of analog switches 38 and 52 as well as controls sampling by sample and hold circuits 36 and 54 and controls conversion by analog-to-digital converter 44. The output of PLL 58 also controls latching of the current and voltage latches 46 and 56, and controls analog switch 42 alternately between the outputs of sample and hold circuits 36 and 54.

The operation of the circuitry shown in FIG. 2 to develop a digital display that is a function of measured three-phase power is provided in U.S. application Ser. No. 423,398, filed Sept. 24, 1982, now abandoned, to the assignee of this invention, and incorporated herein by reference. Although it accordingly is not necessary to detail the operation of the circuitry shown, generally the phase locked loop 58 in FIG. 2 generates clock signals at a rate that is approximately an integral multiple of the line frequency (e.g., 60 Hz.) at which the three-phase power waveforms are successively sampled. During sampling of the three-phase currents, current latch 46 is loaded with samples to be transferred on bus 48 to microprocessor 50. During the voltage phase samples, voltage latch 56 transfers samples to the micrprocessor 50 along the same bus 48.

Divider 61 both synchronizes microprocessor 50 to the 60 Hz. power waveform and identifies the particular phase being monitored for processing by the microprocessor.

Thus, the circuit 20 makes three-phase voltage and current measurements by sampling three-phase voltages and currents to develop instantaneous analog values in sample and hold circuits 36, 54. Samples converted to corresponding digital values in converter 44 are applied to microprocessor 50 for scaling and multiplication to obtain instantaneous power, and for integration and time division to obtain average power.

Of particular importance, in addition to displaying digitally energy consumed in watts, VARs, watthours, VAR-hours, etc., as in application Ser. No. 423,398, supra, the circuit 20 additionally displays a "vector" whose direction indicates the direction of power flow on the lines measured and whose length is an indication of the approximate instantaneous value of power.

Figure 3:
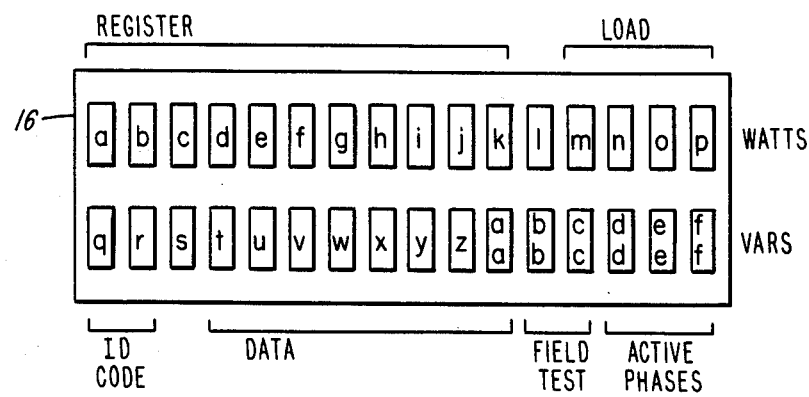
FIG. 3 is a view of the display of the solid state electricity meter of FIGS. 1 and 2.

Referring to FIG. 3, the display 16 (see also FIG. 1) consists of two rows of sixteen liquid crystal display (LCD) elements each. Of course, the number of LCD elements forming each row as well as the number of rows is arbitrary. Furthermore, light emitting diodes (LEDS) or other type of display elements, rather than LCDs, could be used to form the display 16. In any event, in the preferred embodiment, the upper row is controlled by microprocessor 50 through drivers 60 to display a register name (16a–16k) which may include a phase designation, a peak number (multiple peak demand registers are used) and measured quantity name (e.g., KWH). Element 16l may identify load direction (e.g., a "d" may indicate that the register only accumulates data when power is being delivered to a load whereas an "r" may indicate that the register only accumulates data when power is being received from the load) or quadrant number (e.g., a "1" indicates that the register only accumulates data when watts are being delivered to the load, i.e., the load is inductive).

Ignoring LCD elements m-p temporarily, for this discussion, the microprocessor 50 controls the lower row of elements whereby LCD elements q, r may display a register ID code, such as "01", element s may be blank and elements t-aa may display register data in, e.g., kilowatt hours. Elements bb and cc may display codes to indicate that the instrument is undergoing field or factory testing, enabled by internal switch settings, and elements dd-ff may identify the line phases active.

Although the display elements are controlled to display data in the manner as set forth above in accordance with one embodiment of this invention, it is to be understood that except for display elements m-p comprising this invention, the particular data displayed in the remaining display elements are arbitrary and may be other than those proposed herein. Also, different data can be applied to the same display elements in different modes of operation of the meter by implementing default and alternate display modes, in a conventional manner.

Figure 4A:
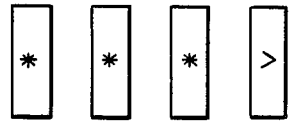
FIGS. 4(a)–4(e) are displays of power having different directions and magnitudes measured by the solid state electricity meter of the invention.
Figure 4B:
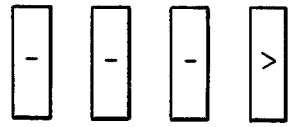
Figure 4C:
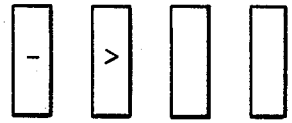
Figure 4D:
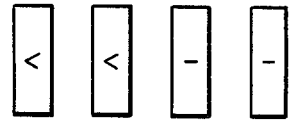

Display elements m-p, in accordance wih the invention, display a vector whose direction indicates the direction of flow of power on the lines measured and whose length approximates the magnitude. FIGS. 4(a)-4(b) are examples of four vector displays provided by elements 16m–16p wherein the ">" simulates counterclockwise rotation of the conventional watthour meter disk and "<" simulates clockwise rotation. The shaft of the arrow has a length formed by up to three of the four LCD elements 16m–16p. In the example of FIGS. 4(a)-4(e), the character forming the shaft of the vector preferably indicates the range of the power measured and the number of elements forming the shaft identifies the magnitude within that range.

The hierarchy of vector shaft characters, together with vector directions, as a function of power direction and amplitude, is as follows:

| SYMBOL | LOAD, % of CLASS |
| --- | --- |
| * * * > | >100 |
| * * > > | 75 to 100 |
| * > > > | 50 to 75 |
| > > > > | 30 to 50 |
| - > > > | 10 to 30 |
| - - > > | 3 to 10 |

-continued

| SYMBOL | LOAD, % of CLASS |
|---|---|
| - - - > | 1 to 3 |
| - - > | 0.3 to 1 |
| - > | 0.1 to 0.3 |
| > | 0.01 to 0.1 |
| - - - - | <0.01, delivered or received |
| < | 0.01 to 0.1 |
| < - | 0.1 to 0.3 |
| < - - | 0.3 to 1 |
| < - - - | 1 to 3 |
| < < - - | 3 to 10 |
| < < < - | 10 to 30 |
| < < < < | 30 to 50 |
| < < < * | 50 to 75 |
| < < * * | 75 to 100 |
| < * * * | >100 |

Vector pointers to the right (clockwise) (">") indicate watts delivered to the load, and vector pointers to the left ("<") indicate watts received from the load. Thus, the vector shown in FIG. 4(a) corresponds to 100% of class delivered to the load. In FIG. 4(b), from one to three percent of class is delivered to the load, and in FIG. 4(c), 0.1 to 0.3% of class is delivered to the load. On the other hand, in FIG. 4(d), 3 to 10% of class is received from the load, and in FIG. 4(e), at least 100% of class is received from the load.

Figure 4E:
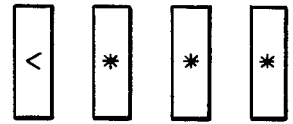

The displays generated in FIGS. 4(a) and 4(e) are developed by microprocessor 50 and applied to the LCD array 16 via a conventional display driver 60 (FIG. 2). Microprocessor 50 is preferably programmed in firmware stored in memory 64 wherein a first portion $M_1$ of the memory contains predetermined ranges of power that generate the various vector symbols as set forth above, and a second portion $M_2$ contains the vector symbols themselves.

Thus, in response to a voltage and current sample pair on bus 48, as shown in the circuit of FIG. 2, the microprocessor 50 obtains the product of the pair to determine instantaneous power and compares that power with the contents of memory portion $M_1$ to determine within which range the sampled power lies. The microprocessor 50 also detects the polarity of the sample product to determine the direction of power flow. Based upon the direction of power flow and the power magnitude, determined by comparison of measured power and power magnitudes stored in $M_1$, a corresponding vector symbol is read from memory portion $M_2$, to be applied through drivers 60 to LCD 16.

During the next sample, the display 16 is updated in accordance with the outputs of memory portions $M_1$, $M_2$ of read only memory 64.

Figure 5B:
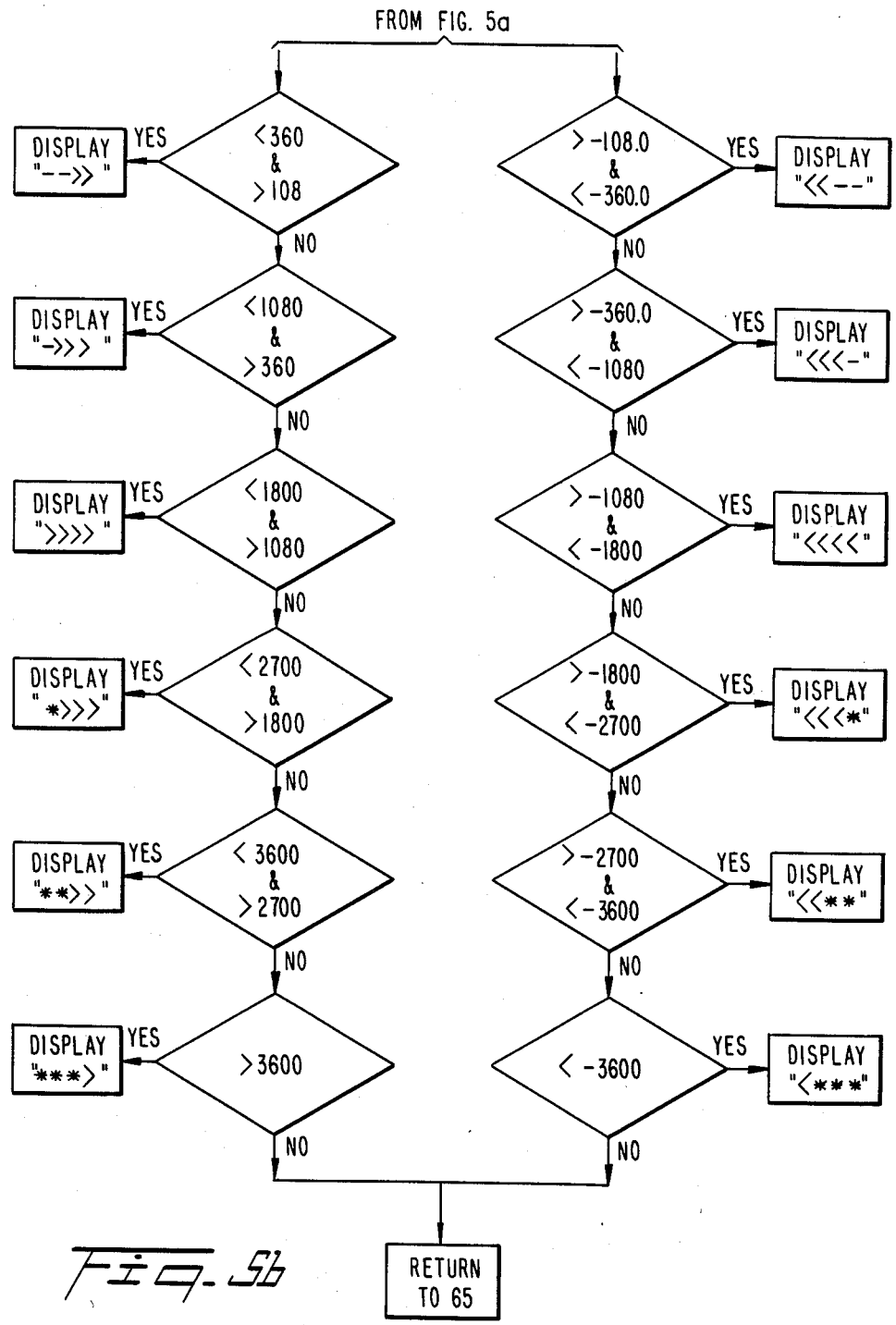

Programming of the microprocessor 50 to generate vector displays in response to samples on bus 48 is shown in FIGS. 5(a) and 5(b) wherein power is first measured at step 64 in the manner set forth above and then polarity tested (step 66). If the power flow is negative, the microprocessor 50 executes the program branch set forth in the right-hand portion of the Figure; otherwise, it executes the branch in the left-hand portion.

Assuming, for example, that the power is negative, the microprocessor 50 determines whether the magnitude of power is less than 0.36 of 1% of class (step 68). If so, the symbol "————" is displayed by LCD 16. This display indicates that the power flow on the line measured is virtually at zero. The constant 0.36 is the magnitude below which the power reading is too noise contaminated to be meaningful.

Similarly, if power flow measured by microprocessor 50 is positive and the power magnitude is less than 0.36% of class (step 70), the display "————" is applied to LCD 16.

If power flow is positive, and the power measured is greater than 0.36% of class, microprocessor 50 determines by comparison with references stored in portion $M_1$ of memory 64, whether the power measured is less than 3.6% of class. If so, the symbol ">" is displayed in LCD 16 (step 72).

If the power measured is greater than 3.6% of class, the microprocessor 60 next determines whether the power measured is less than 10.8% of class. If so, LCD 16 is controlled to display "—>" (step 74).

Similar steps are executed by microprocessor 50 throughout the remainder of the flow chart of FIGS. 5(a) and 5(b) to display each particular vector symbol stored in $M_2$ that corresponds to the direction and approximate magnitude of line power measured by circuit 20.

There accordingly has been described a solid state electricity meter display formed of a number of successive display elements arranged linearly and controlled by microprocessor to form a vector symbol whose direction indicates the direction of power flow measured and whose length indicates approximate power magnitude. The display, which simulates the rotating disk of a conventional electromechanical electricity meter, enables the utility to determine, upon inspection, whether a load being measured by the electricity meter is using or generating power, and indicates the approximate power amplitude. The solid state display, in addition to its inherent improved reliability compared to the conventional electromechanical rotating disk, provides a more accurate estimation of power amplitude than is possible in electromechanical electricity meters.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

We claim:

1. A solid state electricity meter, comprising:
    measurement means coupled to a power line for obtaining voltage and current measurements;
    multiplier means for multiplying together said measurements to obtain the magnitude and direction of line power;
    a display comprising a single linear series of segments;
    first memory means storing a plurality of reference line powers having predetermined magnitudes;
    second memory means storing a plurality of different non-alphanumeric indicia;
    comparator means for comparing a line power obtained from said multiplier means with said plurality of references stored in said first memory means; and
    control means responsive to said comparator means for applying to said display selected ones of said non-alphanumeric indicia to form a vector representation of the magnitude and direction of measured line power.

2. The electricity meter of claim 1, wherein said stored indicia consist of the symbols "—", "*", ">" and "<".

3. The electricity meter of claim 1, wherein said control means comprises a microprocessor and wherein said first and second memory means comprise read only memories.

4. The electricity meter of claim 2, wherein said display consists of at least three display elements and wherein said control means includes means responsive to direction of line power flow to apply selectively a ">" or a "<" to the first or last element of said display.

5. A solid state electricity meter, comprising:
a housing;
measurement means for measuring line current and line voltage;
a display consisting of a plurality of display elements aligned linearly on the housing;
first memory means storing a plurality of reference line powers having different predetermined magnitudes;
second memory means storing a plurality of different non-alphanumeric symbols; and
microprocessor means responsive to said measurement means for (a) multiplying together line voltage and current measurements to obtain measured line power magnitude, (b) comparing the measured line power with said plurality of reference line powers stored in said first memory means, (c) addressing said second memory means in accordance with (b) to read a symbol corresponding to said measured line power and (d) applying a symbol read from said second memory means to said display.

6. The electricity meter of claim 5, wherein said miroprocessor means further includes means for determining direction of flow of said measured line power and wherein said second memory means includes power flow direction symbols representative respectively of power received from and transferred to a load, said microprocessor means including means for applying said power flow direction symbols selectively to the first and last elements of said display.

7. The electricity meter of claim 6, wherein said symbols stored in said second memory means are visual components of a vector.

8. The electricity meter of claim 7, wherein said symbols consist of "—", "*", "<" and ">".

* * * * *